United States Patent
Chen et al.

(10) Patent No.: US 9,842,805 B2
(45) Date of Patent: Dec. 12, 2017

(54) DRIVE-IN MN BEFORE COPPER PLATING (71) Applicant: International Business Machines Corporation, Armonk, NY (US)

(72) Inventors: Hsueh-Chung Chen, Cohoes, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/864,002

(22) Filed: Sep. 24, 2015

(65) Prior Publication Data
US 2017/0092589 A1    Mar. 30, 2017

(51) Int. Cl.
*H01L 21/768*    (2006.01)
*H01L 23/532*    (2006.01)
*H01L 21/288*    (2006.01)
*H01L 23/528*    (2006.01)

(52) U.S. Cl.
CPC .... *H01L 23/53238* (2013.01); *H01L 21/2885* (2013.01); *H01L 21/76802* (2013.01); *H01L 21/76843* (2013.01); *H01L 21/76846* (2013.01); *H01L 21/76864* (2013.01); *H01L 21/76873* (2013.01); *H01L 21/76879* (2013.01); *H01L 21/76882* (2013.01); *H01L 23/528* (2013.01); *H01L 23/5329* (2013.01)

(58) Field of Classification Search
CPC .............................................. H01L 21/76843
See application file for complete search history.

(56) References Cited

U.S. PATENT DOCUMENTS

| | | | |
|---|---|---|---|
| 7,888,253 B2 | 2/2011 | Usui et al. |
| 8,133,813 B2 | 3/2012 | Koike et al. |
| 8,138,084 B2 | 3/2012 | Akolkar |
| 8,361,900 B2 | 1/2013 | Pan et al. |

(Continued)

FOREIGN PATENT DOCUMENTS

JP    2009224705 A    10/2009

OTHER PUBLICATIONS

Jourdan et al., "Evaluation of Metallization Options for Advanced Cu Interconnects Application", ECS Transactions, 34 (1) pp. 515-521 (2011).

(Continued)

*Primary Examiner* — Daniel Luke
(74) *Attorney, Agent, or Firm* — Vazken Alexanian; Michael J. Chang, LLC (57) ABSTRACT

Techniques for forming Cu interconnects in a dielectric are provided. In one aspect, a method of forming a Cu interconnect structure includes: forming at least one trench in a dielectric; depositing a metal liner into the trench; depositing a Mn-containing seed layer on the metal liner within the trench; annealing the Mn-containing seed layer under conditions sufficient to diffuse Mn from the Mn-containing seed layer to an interface between the dielectric and the metal liner forming a barrier layer between the dielectric and the metal liner; and depositing Cu into the trench to form the Cu interconnect, wherein the Cu is deposited into the trench after the annealing is performed. The metal liner may optionally be reflowed such that it is thicker at a bottom of the trench than along sidewalls of the trench. A Cu interconnect structure is also provided.

20 Claims, 5 Drawing Sheets

(56) References Cited

U.S. PATENT DOCUMENTS

| | | |
|---|---|---|
| 8,517,769 B1 | 8/2013 | Lin et al. |
| 8,609,531 B1 | 12/2013 | Zhang |
| 8,653,663 B2 | 2/2014 | Kao et al. |
| 8,802,559 B2 | 8/2014 | Yang et al. |
| 2008/0213998 A1* | 9/2008 | Nagai ............... C23C 14/14 438/653 |
| 2009/0263965 A1 | 10/2009 | Gordon et al. |
| 2010/0099254 A1* | 4/2010 | Narushima ............ C23C 16/44 438/668 |
| 2010/0207177 A1 | 8/2010 | Liu et al. |
| 2012/0121799 A1 | 5/2012 | Fu et al. |
| 2013/0062769 A1* | 3/2013 | Cabral, Jr. ........ H01L 23/53238 257/751 |
| 2014/0332961 A1* | 11/2014 | Lee ..................... B32B 15/01 257/751 |
| 2016/0133513 A1* | 5/2016 | Hegde ............. H01L 23/53238 438/618 |

OTHER PUBLICATIONS

Usui et al., "Highly Reliable Copper Dual-Damascene Interconnects With Self-Formed MnSixOy Barrier Layer", IEEE Transactions on Electron Devices, vol. 53, No. 10, pp. 2492-2498 (Oct. 2006).

Watanabe et al., "Self-formed barrier technology using CuMn alloy seed for copper dual-damascene interconnect with porous-SiOC/porous-PAr hybrid dielectric", Proc. IEEE 2007 International Interconnect Technology Conference (IITC 2007), pp. 7-9 (Jun. 2007).

Koike et al., "Cu alloy metallization for self-forming barrier process", Proc. 2006 IEEE International Interconnect Technology Conference (IITC 20006), pp. 161-163 (Jun. 2006).

Park et al., Self-forming Mn-based diffusion barriers on low-k substrates. Japanese Journal of Applied Physics, 53 pp. 08NL01-1 to 5, (Jul. 2014).

Machine Translation of JP2009224705A by Hiramatsu, Oct. 1, 2009.

* cited by examiner

DRIVE-IN MN BEFORE COPPER PLATING

FIELD OF THE INVENTION

The present invention relates to forming copper (Cu) interconnects in a dielectric, and more particularly, to techniques for forming a barrier layer for Cu interconnects that includes driving-in Mn before plating the Cu.

BACKGROUND OF THE INVENTION

Reduction of copper (Cu) interconnect resistance is becoming an important issue for recent technology development. One of the promising approaches is to increase the Cu volume fraction by eliminating/reducing the physical liner thickness. Through barrier manganese silicate $MnSiO_3$ formation has been proposed to address the technology challenge. See, for example, Usui et al., "Highly Reliable Copper Dual-Damascene Interconnects With Self-Formed MnSixOy Barrier Layer," IEEE Transactions on Electron Devices, vol. 53, no. 10, pgs. 2492-2499 (October 2006) (hereinafter "Usui").

However, the current integration scheme for forming the $MnSiO_3$ barrier layer has many drawbacks. One notable drawback is that Mn from the barrier layer diffuses into the Cu interconnects. As an impurity, Mn that has diffused into the Cu interconnect undesirably increases the resistance in the interconnect.

Therefore, improved techniques for Cu interconnect fabrication would be desirable.

SUMMARY OF THE INVENTION

The present invention provides techniques for forming copper (Cu) interconnects in a dielectric. In one aspect of the invention, a method of forming a Cu interconnect structure is provided. The method includes the steps of: forming at least one trench in a dielectric; depositing a metal liner into the trench; depositing a manganese (Mn)-containing seed layer on the metal liner within the trench; annealing the Mn-containing seed layer under conditions sufficient to diffuse Mn from the Mn-containing seed layer to an interface between the dielectric and the metal liner forming a barrier layer between the dielectric and the metal liner; and depositing Cu into the trench to form the Cu interconnect, wherein the Cu is deposited into the trench after the annealing is performed.

In another aspect of the invention, another method of forming a Cu interconnect structure is provided. The method includes the steps of: forming at least one trench in a dielectric; depositing a metal liner into the trench, wherein the metal liner is deposited as a conformal layer lining the trench; annealing the metal liner under conditions sufficient to reflow the metal liner such that the metal liner is thicker at a bottom of the trench than along sidewalls of the trench; depositing a Mn-containing seed layer on the metal liner within the trench; annealing the Mn-containing seed layer under conditions sufficient to diffuse Mn from the Mn-containing seed layer to an interface between the dielectric and the metal liner forming a barrier layer between the dielectric and the metal liner; and depositing Cu into the trench to form the Cu interconnect, wherein the Cu is deposited into the trench after the annealing is performed.

In yet another aspect of the invention, an interconnect structure is provided. The interconnect structure includes: at least one trench in a dielectric; a barrier layer within the trench, wherein the barrier layer comprises manganese silicate; a metal liner on the barrier layer within the trench, wherein the barrier layer is present between the metal liner and the dielectric; and a Cu interconnect on the metal liner within the trench, wherein the Cu interconnect is Mn-free.

In still yet another aspect of the invention, a method of forming a Cu interconnect structure is provided. The method includes the steps of: forming at least one trench in a dielectric; depositing a first barrier layer into the trench, wherein the first barrier layer comprises a tantalum (Ta) and tantalum nitride (TaN) film stack; depositing a metal liner onto the first barrier layer; depositing a Mn-containing seed layer on the metal liner within the trench; annealing the Mn-containing seed layer under conditions sufficient to diffuse Mn from the Mn-containing seed layer to an interface between the dielectric and the first barrier layer forming a second barrier layer between the dielectric and the first barrier layer; and depositing Cu into the trench to form the Cu interconnect, wherein the Cu is deposited into the trench after the annealing is performed.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for fabricating copper (Cu) interconnects which avoid the problems associated with diffusion of barrier layer materials, such as manganese Mn, into the Cu by using an anneal to drive-in the Mn before plating of the Cu is carried out. As a result, the Cu interconnect formed by way of the present process is free of Mn (i.e., by contrast to conventional processes, there is no Mn present in the Cu interconnects formed by the instant process).

More specifically, the Cu interconnect is formed in an interlayer dielectric (ILD). A metal liner will be present between the Cu interconnect and the dielectric. The goal here is to form a barrier layer (e.g., from manganese silicate $MnSiO_3$) at the interface with the dielectric, i.e., the barrier layer will be present between the dielectric and the metal liner, without having any Mn diffuse into the Cu during the barrier layer formation. Namely, an anneal is used to drive-in Mn from a Mn-containing seed layer, through the metal liner, to the interface of the metal liner with the dielectric. According to the present techniques, the barrier layer is formed prior to plating the Cu. Thus, during the drive-in anneal Mn cannot diffuse into the Cu interconnect, since the Cu interconnect is not yet present.

Figure 1:
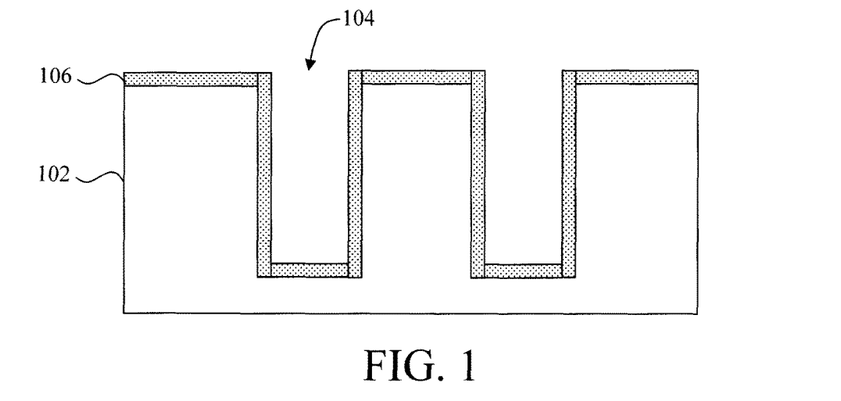
FIG. 1 is a cross-sectional diagram illustrating a dielectric media having trenches patterned therein, and a conformal metal liner having been formed lining the trenches and covering a top surface of the dielectric media according to an embodiment of the present invention.

Given the above overview of the present techniques, an exemplary embodiment is now described by way of reference to FIGS. 1-4 which illustrate a methodology for forming a Cu interconnect in an ILD. As shown in FIG. 1, the process begins with a dielectric media 102 in which the present Cu interconnects will be formed. According to an exemplary embodiment, dielectric media 102 includes, but is not limited to, silsesquioxanes, carbon doped oxides (i.e., organosilicates) that include atoms of silicon (Si), carbon (C), oxygen (O) and hydrogen (H), thermosetting polyarylene ethers, or multi-layers thereof. The term "polyarylene," as used herein, denotes aryl moieties or inertly substituted aryl moieties which are linked together by bonds, fused rings, or inert linking groups such as, for example, oxygen, sulfur, sulfone, sulfoxide, carbonyl and the like. Dielectric media 102 will serve as an ILD to electrically separate the Cu interconnect lines embedded therein. Thus the terms "dielectric media" and "ILD" will be used interchangeably herein.

As shown in FIG. 1, one or more trenches 104 are patterned in the dielectric media 102. By way of example only, trenches 104 may be patterned in the dielectric media 102 using standard lithography and etching techniques. A conformal metal liner 106 is then formed in/lining the trenches 104 and covering a top surface of the dielectric media 102. See FIG. 1. According to an exemplary embodiment, the metal liner 106 includes metals such as cobalt (Co), ruthenium (Ru), iridium (Ir), platinum (Pt), rhodium (Rh), tungsten (W), titanium (Ti), gold (Au), silver (Ag), palladium (Pd), osmium (Os), and combinations thereof—e.g., a Co—Ru alloy. The metal liner 106 is preferably formed using a conformal deposition process, such as atomic layer deposition (ALD), chemical vapor deposition (CVD), physical vapor deposition (PVD), sputtering, or electrochemical plating, to a thickness of from about 2 millimeters (mm) to about 10 mm, and ranges therebetween. In the final structure, the metal liner 106 will be present between the Cu interconnect and the dielectric media 102.

It is notable that, in this embodiment, the metal liner is a conformal layer of uniform thickness (see thickness values provided above). An alternative embodiment will be provided below wherein an anneal is used to reflow the metal liner such that there is a thicker portion of the metal liner at the bottom of the trenches. Having a thicker metal liner at the bottom of the trenches is thought to enhance electromigration (EM) and stress migration (SM). See, for example, U.S. Pat. No. 8,802,559 issued to Yang et al., entitled "Interconnect Structure With an Electromigration and Stress Migration Enhancement Liner," the contents of which are incorporated by reference as if fully set forth herein. One potential tradeoff, however, is that a thicker metal liner can lead to a slight increase in the resistance of the interconnect and requires an additional step to reflow the liner material (see below).

Figure 2:
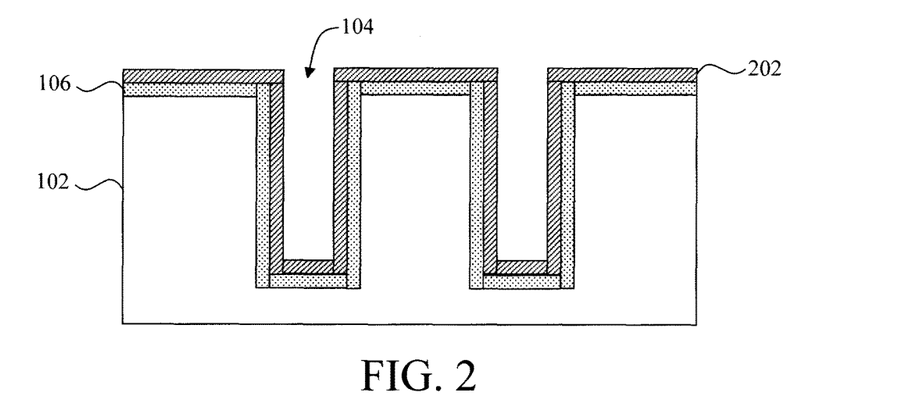
FIG. 2 is a cross-sectional diagram illustrating a conformal manganese (Mn)-containing seed layer having been deposited onto the metal liner according to an embodiment of the present invention.

Next, as shown in FIG. 2 a conformal manganese (Mn)-containing seed layer 202 is deposited onto the metal liner 106. A seed layer serves as a conductive layer during the plating process used to plate Cu into the trenches. Namely, a thin seed layer can be deposited into the trenches, followed by electroplating of the bulk of the Cu to form the interconnects. As shown in FIG. 2, the Mn-containing seed layer 202 is present (on the metal liner 106) lining the trenches 104 and on the top surface of the dielectric media 102. According to an exemplary embodiment, the Mn-containing seed layer 202 contains Mn in combination with another metal, such Cu—e.g., a CuMn alloy. By way of example only, the Mn-containing seed layers described herein contain from about 0.1 weight percent (wt. %) Mn to about 5 wt. % Mn, and ranges therebetween. The Mn-containing seed layer 202 is preferably formed using a conformal deposition process, such as ALD, CVD, PVD, sputtering, or electrochemical plating, to a thickness of from about 10 angstroms (Å) to about 300 Å, and ranges therebetween, e.g., from about 10 Å to about 150 Å, and ranges therebetween.

As provided above, a barrier layer will be formed at the interface with the dielectric media, i.e., between the dielectric media and the metal liner, using Mn from the seed layer. This will involve an anneal to drive-in Mn from the seed layer to the interface with the dielectric media. With conventional processes, back diffusion occurs during this Mn drive-in step resulting in Mn being present in the Cu interconnect. Mn acts as an impurity in the Cu interconnect (i.e., it forms an alloy with Cu—CuMn), which undesirably increases the interconnect resistance. Advantageously, the present techniques avoid back diffusion of Mn into the Cu interconnect by plating the Cu for the interconnect only after the barrier layer has been formed. As a result, the Cu interconnect formed via the present techniques is completely free of Mn. By comparison, with conventional process (such as those described in Usui), the resulting interconnects will contain both Cu and Mn as a byproduct of the back diffusion.

Figure 3:
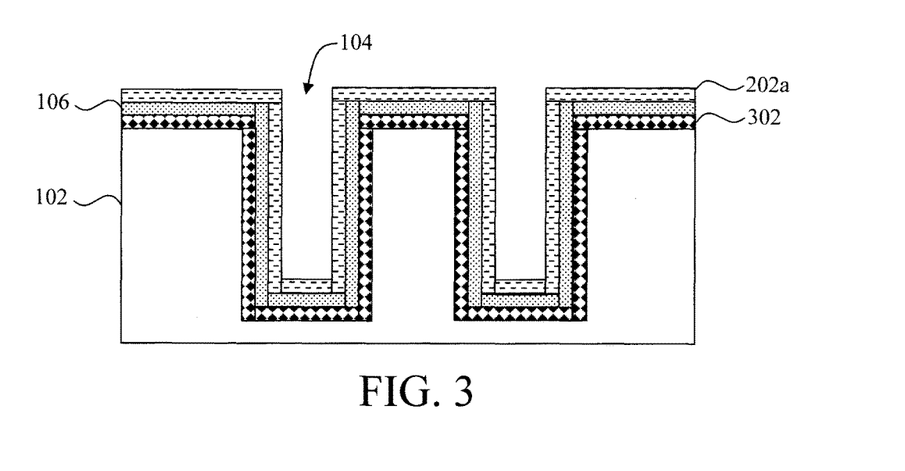
FIG. 3 is a cross-sectional diagram illustrating Mn from the Mn-containing seed layer having been diffused through the metal liner to form a barrier layer at an interface between the dielectric media and the metal liner according to an embodiment of the present invention.

Namely, as shown in FIG. 3 the Mn-containing seed layer 202 is annealed under conditions sufficient to drive/diffuse Mn from the Mn-containing seed layer 202, through the metal liner 106, to an interface of the dielectric media 102 and the metal liner 106. Suitable conditions include, but are not limited to, a temperature of from about 250° C. to about 400° C., and ranges therebetween, e.g., a temperature of from about 300° C. to about 350° C., and ranges therebetween, and a duration of from about 1 minute to about 5 minutes, and ranges therebetween. The annealing can be performed in an ambient atmosphere or under reduced pressure. By reducing th the pressure, one can lower the processing temperatures. For instance, the conditions might additionally include a (reduced) pressure of from about $1 \times 10^{-3}$ torr to about $1 \times 10^{-5}$ torr, and ranges therebetween. The Mn diffused by this drive-in anneal will react with the metal liner/dielectric materials at this interface to form a barrier layer 302 between the dielectric media 102 and the metal liner 106. According to an exemplary embodiment, the dielectric media 102 contains Si, and the barrier layer 302 formed is manganese silicate $MnSiO_3$.

As provided above, according to an exemplary embodiment, the Mn-containing seed layer 202 is CuMn. In that case, what will remain after the drive in anneal is a layer of Cu 202a lining the metal liner 106. See FIG. 3. According to an exemplary embodiment, the Cu layer 202a is Mn-free (i.e., there is no Mn present in the Cu layer 202a post drive-in anneal).

Next, Cu is deposited into and filling the trenches 104 (i.e., onto the Cu layer 202a) forming Cu interconnects 402. See FIG. 4. While the Cu deposited in this step to fill the trenches 104 will be indistinguishable from the Cu in layer 202a, for illustrative purposes only the Cu in layer 202a is shown labeled in FIG. 4. Further, for clarity of description the Cu layer 202a may also be referred to herein as a first Cu layer, and the Cu deposited to fill the trenches 104 might be referred to herein as a second Cu layer. According to an exemplary embodiment, the Cu fill is deposited in this step using an electrochemical plating process.

Figure 4:
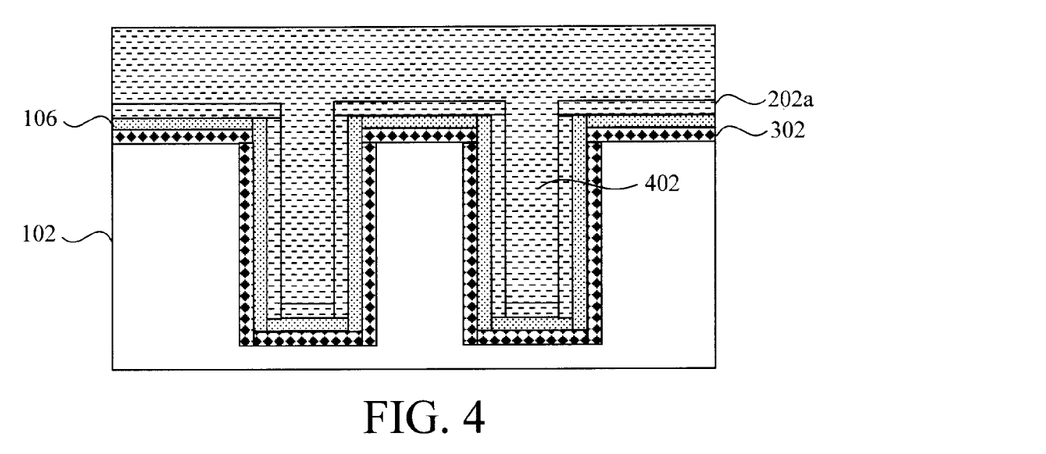
FIG. 4 is a cross-sectional diagram illustrating copper (Cu) having been deposited into and filling the trenches forming Cu interconnects according to an embodiment of the present invention.

As shown in FIG. 4, the Cu might overfill the trenches 104. In that case, it may be desirable to remove the excess Cu using, for example, a conventional polishing/planarizing process such as chemical mechanical polishing (CMP).

As noted above, the Cu layer 202a is Mn-free. Further, since the Cu fill is performed after the Mn drive-in diffusion, there will likewise be no Mn present in that Cu fill layer. As such, the Cu interconnect formed by the present process will be entirely Mn-free.

As provided above, in order to enhance electromigration (EM) and stress migration (SM) it may be desirable to configure the metal liner to be thicker at the bottom of the trenches than along the sidewalls of the trenches. Such a configuration of the metal liner may be achieved in accordance with the present techniques. In that regard, an alternative embodiment is now described wherein an additional annealing step is performed to reflow the metal liner material to the bottom of the trenches, thereby building up the thickness of the metal liner material at the bottom of the trenches.

The first few steps are the same as described above. Namely, the process begins by patterning one or more trenches 104 in the dielectric media 102, and then forming a conformal metal liner 106 in/lining the trenches 104 and covering a top surface of the dielectric media 102. Thus, the process up to this point is the same as is illustrated in FIG. 1. In this alternative embodiment however, moving from FIG. 1 to FIG. 5, an anneal is next performed under conditions sufficient to reflow the metal liner material such that a portion of the metal liner material on the sidewalls of the trenches 104 is redistributed to the bottom of the trenches 104, resulting in a metal liner 106a being thicker at the bottom of the trenches 104 than along the sidewalls of the trenches 104. See FIG. 5. According to an exemplary embodiment, the conditions for this reflow anneal include, but are not limited to, a temperature of from about 250° C. to about 400° C., and ranges therebetween, e.g., a temperature of from about 300° C. to about 350° C., and ranges therebetween, and a duration of from about 1 minute to about 5 minutes, and ranges therebetween.

Figure 5:
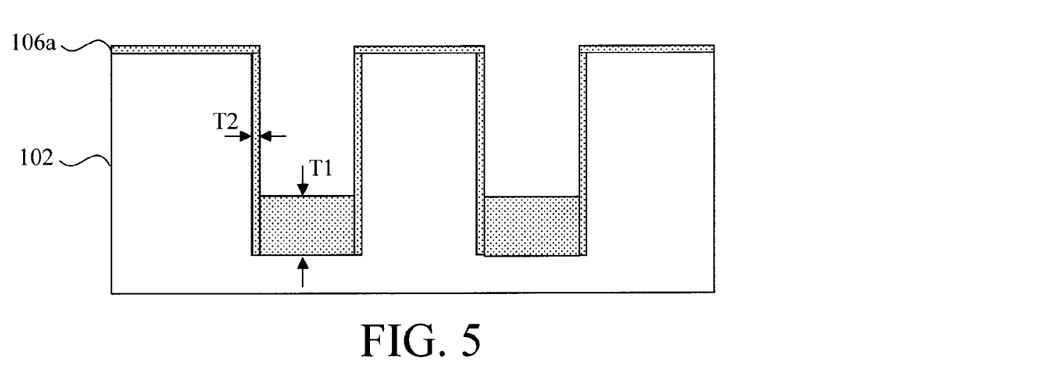
FIG. 5 is a cross-sectional diagram illustrating, in an alternative embodiment, an optional anneal having been performed to reflow the metal liner such that the metal liner becomes thicker at a bottom of the trenches than along sidewalls of the trenches according to an embodiment of the present invention.

As shown in FIG. 5, based on the redistribution of the metal liner material the metal liner present on the sidewalls of the trenches 104 will be reduced in thickness and the metal liner present on the bottom of the trenches 104 will be increased in thickness. Compare FIG. 1 and FIG. 5. According to an exemplary embodiment, the metal liner on the bottom of the trenches 104 has a thickness T1 and the metal liner along the sidewalls of the trenches 104 has a thickness T2, wherein T1 is at least 3 times greater than T2.

Figure 6:
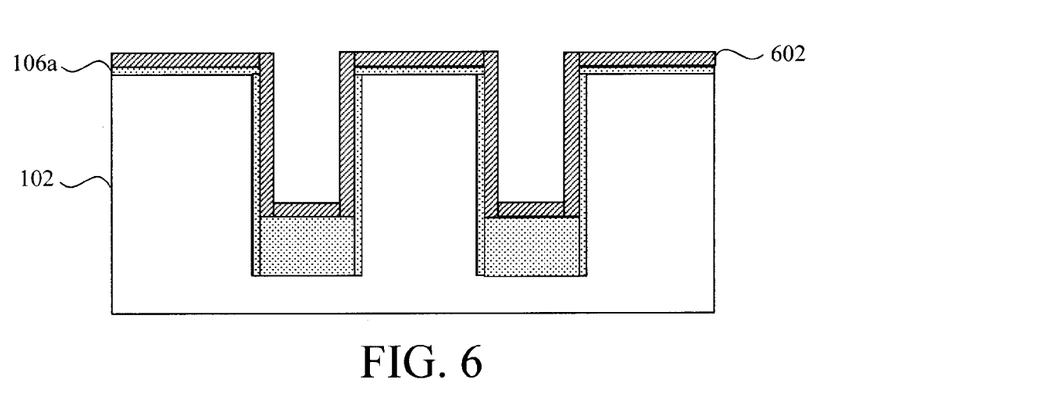
FIG. 6 is a cross-sectional diagram illustrating a conformal Mn-containing seed layer having been deposited onto the metal liner according to an embodiment of the present invention.

Next, according to this alternative embodiment, as shown in FIG. 6 a conformal Mn-containing seed layer 602 is deposited onto the metal liner 106a. Thus, as shown in FIG. 6, the Mn-containing seed layer 602 is present (on the metal liner 106a) lining the trenches 104 and on the top surface of the dielectric media 102. According to an exemplary embodiment, the Mn-containing seed layer 602 contains a CuMn alloy. As provided above, the Mn-containing seed layer 602 may be formed using a conformal deposition process, such as ALD, CVD, PVD, sputtering, or electrochemical plating, to a thickness of from about 50 Å to about 300 Å, and ranges therebetween, e.g., from about 100 Å to about 150 Å, and ranges therebetween.

In the same manner as described above, an anneal to drive-in Mn from the seed layer to the interface with the dielectric media will be performed before Cu is plated into the trenches so as to avoid back diffusion of Mn from the seed layer into the plated Cu. As a result, the Cu interconnects formed by way of the present techniques are Mn-free.

Figure 7:
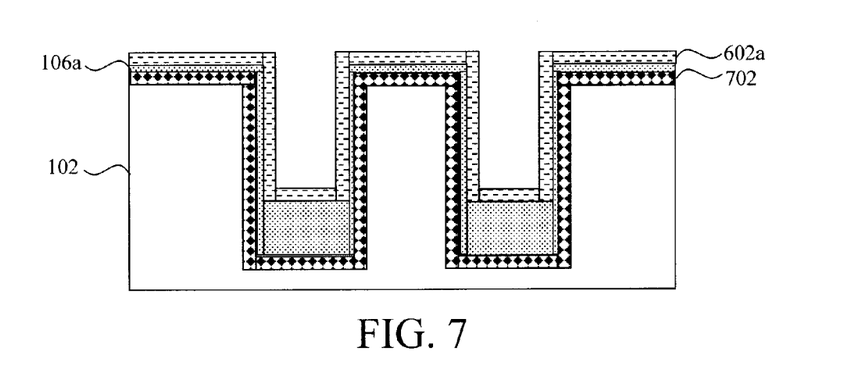
FIG. 7 is a cross-sectional diagram illustrating Mn from the Mn-containing seed layer having been diffused through the metal liner to form a barrier layer at an interface between the dielectric media and the metal liner according to an embodiment of the present invention.

Namely, as shown in FIG. 7 the Mn-containing seed layer 602 is annealed under conditions sufficient to drive/diffuse Mn from the Mn-containing seed layer 602, through the metal liner 106a, to an interface of the dielectric media 102 and the metal liner 106a. As described above, suitable conditions include, but are not limited to, a temperature of from about 250° C. to about 400° C., and ranges therebetween, e.g., a temperature of from about 300° C. to about 350° C., and ranges therebetween, a pressure of from about $1 \times 10^{-3}$ torr to about $1 \times 10^{-5}$ torr, and ranges therebetween, and duration of from about 1 minute to about 5 minutes, and ranges therebetween. The Mn diffused by this drive-in anneal will react with the metal liner/dielectric materials at this interface to form a barrier layer 702 between the dielectric media 102 and the metal liner 106*a*. According to an exemplary embodiment, the dielectric media 102 contains Si, and the barrier layer 702 formed is manganese silicate $MnSiO_3$.

According to an exemplary embodiment, the Mn-containing seed layer 602 is a CuMn alloy. In that case, what will remain after the drive in anneal is a layer of Cu 602*a* lining the metal liner 106*a*. See FIG. 7. According to an exemplary embodiment, the Cu layer 602*a* is Mn-free (i.e., there is no Mn present in the Cu layer 602*a* post drive-in anneal).

Figure 8:
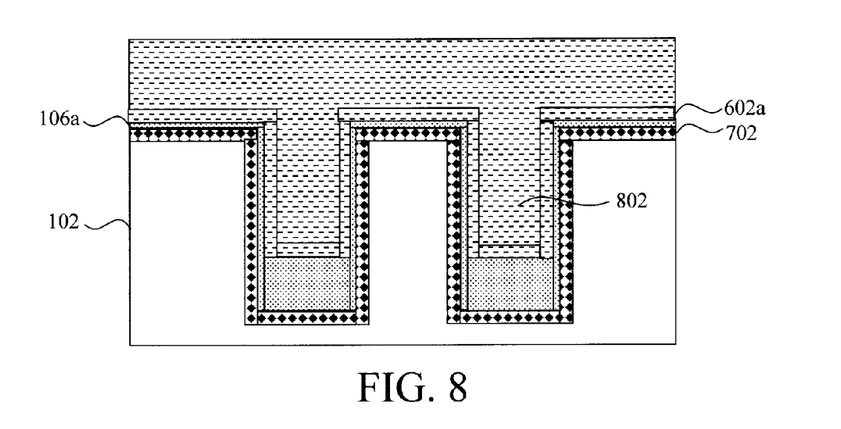
FIG. 8 is a cross-sectional diagram illustrating Cu having been deposited into and filling the trenches forming Cu interconnects according to an embodiment of the present invention.

Next, as shown in FIG. 8, Cu is deposited into and filling the trenches 104 (i.e., onto the Cu layer 602*a*) forming Cu interconnects 802. While the Cu deposited in this step to fill the trenches 104 will be indistinguishable from the Cu in layer 602*a*, for illustrative purposes only the Cu in layer 602*a* is shown labeled in FIG. 8. Further, for clarity of description the Cu layer 602*a* may also be referred to herein as a first Cu layer, and the Cu deposited to fill the trenches 104 might be referred to herein as a second Cu layer. According to an exemplary embodiment, the Cu fill is deposited in this step using an electrochemical plating process.

As shown in FIG. 8, the Cu might overfill the trenches 104. In that case, it may be desirable to remove the excess Cu using, for example, a conventional polishing/planarizing process such as chemical mechanical polishing (CMP).

As noted above, the Cu layer 602*a* is Mn-free. Further, since the Cu fill is performed after the Mn drive-in diffusion, there will likewise be no Mn present in that Cu fill layer. As such, the Cu interconnect formed by the present process will be entirely Mn-free.

In accordance with the above-described techniques, it may also be desirable to initially deposit a (first) barrier layer lining the trenches, followed by the metal liner, Mn-containing seed layer, etc. This initial/first barrier layer can help provide better film coverage and uniformity of the metal liner material (i.e., without a barrier layer present during deposition of the metal liner, the metal liner material tends to be thicker at the tops of the trenches). Then, the Mn drive-in anneal can be performed (as described above) to form a (second) barrier layer between the dielectric and the first barrier layer. Namely, the Mn atoms can easily penetrate the first barrier layer during the drive-in anneal. This alternative embodiment in now described in detail by way of reference to FIGS. 9-14. For ease and clarity of description, reference is made to the above-description for those steps which are performed in the same manner. Further, alike structures are numbered alike in the following description.

Figure 9:
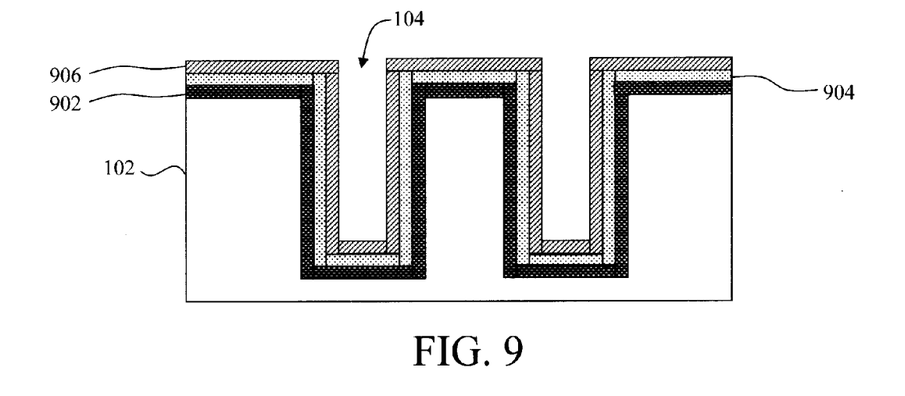
FIG. 9 is a cross-sectional diagram illustrating, in an alternative embodiment, one or more trenches having been patterned in a dielectric media, a first barrier layer having been formed lining the trenches and covering a top surface of the dielectric media, a conformal metal liner having been formed on the first barrier layer, and a conformal Mn-containing seed layer having been deposited onto the metal liner according to an embodiment of the present invention.
Figure 10:
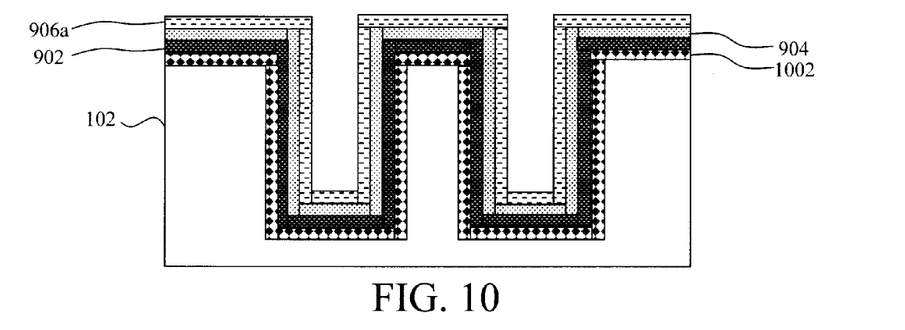
FIG. 10 is a cross-sectional diagram illustrating Mn from the Mn-containing seed layer having been diffused through the metal liner and the first barrier layer to form a second barrier layer at an interface between the dielectric media and the first barrier layer according to an embodiment of the present invention.
Figure 11:
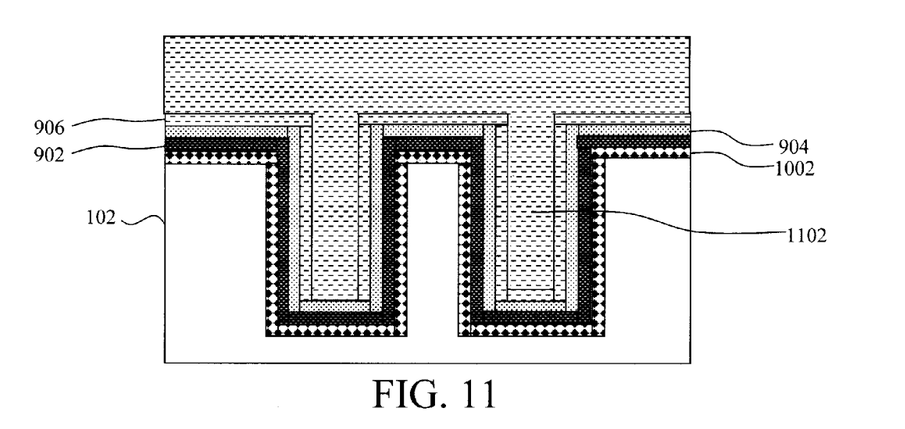
FIG. 11 is a cross-sectional diagram illustrating Cu having been deposited into and filling the trenches forming Cu interconnects according to an embodiment of the present invention.
Figure 12:
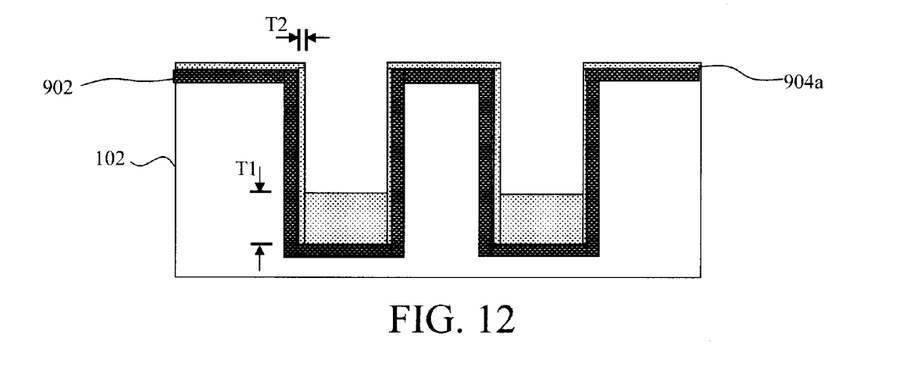
FIG. 12 is a cross-sectional diagram illustrating, in an alternative embodiment, one or more trenches having been patterned in a dielectric media, a first barrier layer having been formed lining the trenches and covering a top surface of the dielectric media, a conformal metal liner having been formed on the first barrier layer, and an optional anneal having been performed to reflow the metal liner such that the metal liner becomes thicker at a bottom of the trenches than along sidewalls of the trenches according to an embodiment of the present invention.
Figure 13:
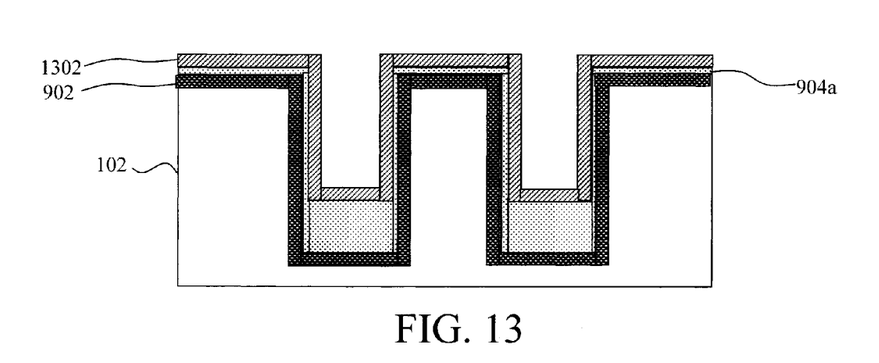
FIG. 13 is a cross-sectional diagram illustrating a conformal Mn-containing seed layer having been deposited onto the metal liner according to an embodiment of the present invention.
Figure 14:
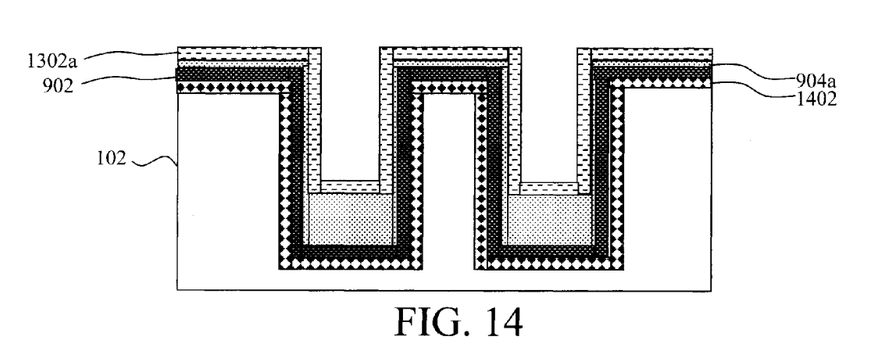
FIG. 14 is a cross-sectional diagram illustrating Mn from the Mn-containing seed layer having been diffused through the metal liner to form a second barrier layer at an interface between the dielectric media and the first barrier layer according to an embodiment of the present invention.

As shown in FIG. 9, in the same manner as described above, one or more trenches 104 are patterned in the dielectric media 102. In this example, a first barrier layer 902 is next formed lining the trenches 104 and covering a top surface of the dielectric media 102. According to an exemplary embodiment, the first barrier layer 902 is formed from a conventional tantalum (Ta) and tantalum nitride (TaN) film stack. For instance, the first barrier layer 902 can be formed by first sputtering Ta and then reactively sputtering TaN to form the barrier layer film stack. This barrier layer configuration will also be referred to herein as a Ta/TaN barrier layer.

Next, in the same manner as described above, a conformal metal liner 904 is formed on the first barrier layer 902, and a conformal Mn-containing seed layer 906 is then deposited onto the metal liner 904. An anneal is then performed to drive in Mn from the Mn-containing seed layer, through the metal liner 904 and, in this example, also through the first barrier layer 902 to form a second barrier layer 1002 at an interface between the dielectric media and the first barrier layer 902. See FIG. 10. The conditions for this Mn drive-in anneal step were provided above. It is notable that the crystalline structure of the Ta/TaN barrier layer is columnar in shape which is normal to the trench sidewall. As a result, Mn atoms can penetrate through it by thermal diffusion. According to an exemplary embodiment, the Mn-containing seed layer 906 is a CuMn alloy. In that case, what will remain after the drive in anneal is a layer of Cu 906*a* lining the metal liner 904. According to an exemplary embodiment, the Cu layer 906*a* is Mn-free (i.e., there is no Mn present in the Cu layer 906*a* post drive-in anneal).

The remainder of the process is the same as detailed above. Namely, Cu can be deposited into and filling the trenches thereby forming Cu interconnects 1102. See FIG. 11. Additionally, in the same manner as described above, one may optionally take steps to reflow the metal liner by way of an anneal, redistributing the metal liner material such that the metal liner (now given reference numeral 904*a*) is thicker at the bottom of the trenches 104 than along the sidewalls of the trenches 104. See FIG. 12. In this example, the first barrier layer 902 is deposited into the trenches 104, followed by the metal layer 904. The reflow anneal is then performed to redistribute the metal liner material. Suitable conditions for this reflow anneal were provided above. It is notable that, as per the instant example, when the first (e.g., Ta/TaN barrier layer) is already present during this reflow anneal, it will not be affected since it is a rigid layer that will not reflow under these annealing temperatures. According to an exemplary embodiment, following the reflow anneal, the metal liner on the bottom of the trenches 104 has a thickness T1 and the metal liner along the sidewalls of the trenches 104 has a thickness T2, wherein T1 is at least 3 times greater than T2.

Next, in the same manner as described above, a conformal Mn-containing seed layer 1302 is then deposited onto the metal liner 904*a*. See FIG. 13. An anneal is performed to drive in Mn from the Mn-containing seed layer, through the metal liner 904*a* and the first barrier layer 902 to form a second barrier layer 1402 at an interface between the dielectric media and the first barrier layer 902. See FIG. 14. Suitable conditions for this drive-in anneal were provided above. According to an exemplary embodiment, the Mn-containing seed layer 1302 is a CuMn alloy. In that case, what will remain after the drive in anneal is a layer of Cu 1302*a* lining the metal liner 904*a*. According to an exemplary embodiment, the Cu layer 1302*a* is Mn-free (i.e., there is no Mn present in the Cu layer 1302*a* post drive-in anneal). The remainder of the process is the same as detailed above, i.e., to deposit Cu into the trenches forming the Cu interconnects, etc., and thus is not repeated in the figures.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a copper (Cu) interconnect structure, the method comprising the steps of:
   forming at least one trench in a dielectric;
   depositing a metal liner into the trench;

depositing a manganese (Mn)-containing seed layer on the metal liner within the trench;

annealing the Mn-containing seed layer under conditions sufficient to diffuse Mn from the Mn-containing seed layer, through the metal liner, to an interface between the dielectric and the metal liner forming a barrier layer between the dielectric and the metal liner along a bottom and sidewalls of the trench, and forming a conductive seed layer which is completely free of Mn lining the metal liner within the trench; and depositing Cu into the trench, onto the conductive seed layer, to form the Cu interconnect, wherein the Cu is deposited into the trench after the annealing is performed forming the Cu interconnect that is completely free of Mn.

2. The method of claim 1, wherein the dielectric is selected from the group consisting of: silsesquioxanes, carbon doped oxides that include atoms of silicon (Si), carbon (C), oxygen (O) and hydrogen (H), thermosetting polyarylene ethers, and combinations thereof.

3. The method of claim 2, wherein the barrier layer comprises manganese silicate.

4. The method of claim 1, wherein the Cu interconnect is Mn-free.

5. The method of claim 1, wherein the metal liner comprises at least one metal selected from the group consisting of: cobalt (Co), ruthenium (Ru), iridium (Ir), platinum (Pt), rhodium (Rh), tungsten (W), titanium (Ti), gold (Au), silver (Ag), palladium (Pd), osmium (Os), and combinations thereof.

6. The method of claim 1, wherein the conditions sufficient to diffuse the Mn from the Mn-containing seed layer to the interface between the dielectric and the metal liner comprise a temperature of from about 250° C. to about 400° C., and ranges therebetween.

7. The method of claim 1, wherein the conditions sufficient to diffuse the Mn from the Mn-containing seed layer to the interface between the dielectric and the metal liner comprise a temperature of from about 300° C. to about 350° C., and ranges therebetween.

8. The method of claim 1, wherein the conditions sufficient to diffuse the Mn from the Mn-containing seed layer to the interface between the dielectric and the metal liner comprise a pressure of from about from about $1 \times 10^{-3}$ torr to about $1 \times 10^{-5}$ torr, and ranges therebetween.

9. The method of claim 1, wherein the conditions sufficient to diffuse the Mn from the Mn-containing seed layer to the interface between the dielectric and the metal liner comprise a duration of from about 1 minute to about 5 minutes, and ranges therebetween.

10. The method of claim 1, wherein the Cu is deposited into the trench using an electrochemical plating process.

11. The method of claim 1, further comprising the steps of:

depositing the metal liner as a conformal layer lining the trench; and annealing the metal liner under conditions sufficient to reflow the metal liner such that the metal liner is thicker at a bottom of the trench than along sidewalls of the trench, wherein the metal liner is annealed to reflow the metal liner prior to depositing the Mn-containing seed layer on the metal liner, such that the Mn-containing seed layer is deposited onto the metal liner that is thicker at the bottom of the trench than along the sidewalls of the trench.

12. The method of claim 11, wherein a thickness of the metal liner at the bottom of the trench is at least 3 times greater than a thickness of the metal liner along the sidewalls of the trench.

13. The method of claim 11, wherein the conditions sufficient to reflow the metal liner comprise a temperature of from about 250° C. to about 400° C., and ranges therebetween.

14. The method of claim 11, wherein the conditions sufficient to reflow the metal liner comprise a temperature of from about 300° C. to about 350° C., and ranges therebetween.

15. The method of claim 11, wherein the conditions sufficient to reflow the metal liner comprise a duration of from about 1 minute to about 5 minutes, and ranges therebetween.

16. The method of claim 1, wherein the Mn-containing seed layer comprises a Mn—Cu alloy.

17. A method of forming a Cu interconnect structure, the method comprising the steps of:

forming at least one trench in a dielectric;

depositing a metal liner into the trench, wherein the metal liner is deposited as a conformal layer lining the trench;

annealing the metal liner under conditions sufficient to reflow the metal liner such that the metal liner is thicker at a bottom of the trench than along sidewalls of the trench, wherein the metal liner is annealed to reflow the metal liner prior to depositing an Mn-containing seed layer on the metal liner, such that the Mn-containing seed layer is deposited onto the metal liner that is thicker at the bottom of the trench than along the sidewalls of the trench;

depositing the Mn-containing seed layer on the metal liner within the trench;

annealing the Mn-containing seed layer under conditions sufficient to diffuse Mn from the Mn-containing seed layer, through the metal liner, to an interface between the dielectric and the metal liner forming a barrier layer between the dielectric and the metal liner along the bottom and the sidewalls of the trench, and forming a conductive seed layer which is completely free of Mn lining the metal liner within the trench; and depositing Cu into the trench, onto the conductive seed layer, to form the Cu interconnect, wherein the Cu is deposited into the trench after the annealing is performed forming the Cu interconnect that is completely free of Mn.

18. The method of claim 17, wherein the Cu interconnect is Mn-free.

19. A method of forming a Cu interconnect structure, the method comprising the steps of:

forming at least one trench in a dielectric;

depositing a first barrier layer into the trench, wherein the first barrier layer comprises a tantalum (Ta) and tantalum nitride (TaN) film stack;

depositing a metal liner onto the first barrier layer;

depositing a Mn-containing seed layer on the metal liner within the trench;

annealing the Mn-containing seed layer under conditions sufficient to diffuse Mn from the Mn-containing seed layer, through the metal liner and the first barrier layer, to an interface between the dielectric and the first barrier layer forming a second barrier layer between the dielectric and the first barrier layer along a bottom and sidewalls of the trench, and forming a conductive seed layer which is completely free of Mn lining the metal liner within the trench; and depositing Cu into the trench, onto the conductive seed layer, to form the Cu interconnect, wherein the Cu is deposited into the trench after the annealing is performed forming the Cu interconnect that is completely free of Mn.

20. The method of claim 19, further comprising the steps of:

depositing the metal liner as a conformal layer lining the trench; and annealing the metal liner under conditions sufficient to reflow the metal liner while leaving the first barrier layer unaffected such that the metal liner is thicker at the bottom of the trench than along the sidewalls of the trench while the first barrier layer remains conformal along the bottom and the sidewalls of the trench, wherein the metal liner is annealed to reflow the metal liner prior to depositing the Mn-containing seed layer on the metal liner, such that the Mn-containing seed layer is deposited onto the metal liner that is thicker at the bottom of the trench than along the sidewalls of the trench.

* * * * *